United States Patent [19]
Gipson et al.

[11] Patent Number: 4,732,446
[45] Date of Patent: Mar. 22, 1988

[54] ELECTRICAL CIRCUIT AND OPTICAL DATA BUSS

[76] Inventors: Lamar Gipson, 11510 SW. 181 St., Miami, Fla. 33157; William P. Batina, 9310 Fontainebleu Blvd., Apt. 404, Miami, Fla. 33172

[21] Appl. No.: 782,940

[22] Filed: Oct. 2, 1985

[51] Int. Cl.[4] ............................................. G02B 6/26
[52] U.S. Cl. ............................ 350/96.15; 350/96.16; 350/96.18; 350/96.20; 361/401
[58] Field of Search ............... 350/96.15, 96.16, 96.18, 350/96.20, 96.21, 96.22; 361/401

[56] References Cited

U.S. PATENT DOCUMENTS

| | | | |
|---|---|---|---|
| 3,968,564 | 7/1976 | Spingthorpe | 350/96.15 X |
| 4,188,708 | 2/1980 | Frederiksen | 350/96.20 X |
| 4,225,213 | 9/1980 | McBride, Jr. et al. | 350/96.20 |
| 4,373,778 | 2/1983 | Adham | 350/96.20 |
| 4,432,604 | 2/1984 | Schwab | 350/96.21 |
| 4,465,333 | 8/1984 | Caserta et al. | 350/96.20 |
| 4,485,391 | 11/1984 | Poulain et al. | 350/96.20 X |
| 4,553,811 | 11/1985 | Becker et al. | 350/96.20 |
| 4,553,813 | 11/1985 | McNaughton et al. | 350/96.20 |
| 4,585,300 | 4/1986 | Landis et al. | 350/96.20 |
| 4,611,886 | 9/1986 | Cline et al. | 350/96.20 |

*Primary Examiner*—John Lee
*Assistant Examiner*—Frank González
*Attorney, Agent, or Firm*—Robert J. Van Der Wall

[57] ABSTRACT

The invention provides a printed circuit board having an optical data buss incorporated therein. Optical fibers are imbedded within the body of the printed circuit board and form an optical data circuitry within the board. Holes are formed in the printed circuit board at predetermined locations to receive a novel chip carrier. The chip carriers have a transparent area that interfaces with the optical fibers. Optical data entering the chip carrier is intercepted by an optical beam-splitter where the signals are directed to a photo transistor die for conversion to electrical signals which are then conducted to an integrated circuit die and into the printed circuitry of the printed circuit board. Electrical data signals from the printed circuit board may be conducted to the chip carrier which also contains a photo-transmitter die where the electrical data signals are converted to optical signal data and are projected to a beam-splitter for deflection into the optical fiber circuitry. When arranged in a stack, printed circuit boards are separated by physically contacting heat conductive plates which may be aluminum that act as heat sinks for cooling purposes. Holes drilled through the plates allow optical data signals to be projected from any one printed circuit board to another throughout the stack. A novel connector is provided to supply electrical power, electrical data input, and optical data input to the system. The optical circuitry is bidirectional.

68 Claims, 15 Drawing Figures

ELECTRICAL CIRCUIT AND OPTICAL DATA BUSS

FIELD OF THE INVENTION

This invention relates to the field of electronic circuitry, both electrical and optical, in general, and to the field of computer circuitry in particular.

BACKGROUND OF THE INVENTION

In the background of the manufacture and development of electronic circuitry using printed circuit boards, many and varied methods and configurations have appeared in an effort to improve such printed circuit boards, and to reduce the overall cost of manufacture. A diligent search of the prior art reveals several concepts which in some ways appear to be somewhat similar to the present invention. In the present invention, a method of automated machine insertion of certain circuit components is disclosed.

U.S. Pat. No. 4,109,296 by Rostek describes an insertable component for machine insertion into a printed circuit board. Flow soldering is then normally used to provide an electrical bond between the board conductors and the component contacts. The sides of the component carrier are straight and fit into a straight sided hole in the printed circuit board and the solder prevents dislodgement. In the present invention, the concept is to provide a solderless connection between the inserted component carrier and the printed circuit board, thus eliminating the soldering operation and also the subsequent cleaning operation to remove flux. Also by using a solderless method, unintentional solder-bridging is avoided.

Another important difference found in the present invention, is that the component carrier is connected with conductive epoxy and is press fitted into a corresponding hole in the printed circuit board. In this manner, a tightly wedged fit is obtained, providing a firm and positive electrical connection between the component carrier and the conductive leads of the printed board.

U.S. Pat. No. 3,192,307 by Lazar teaches a method of inserting a component carrier into a hole in a printed circuit board, using manual means for insertion, the component carrier and the receiving hole having straight sides, the component carrier having tabs for surface contact with printed contacts on the outside surface of the printed circuit board and held in contact by the use of adhesive sheeting. In contrast, the present invention provides that the chip carriers are press fitted into a mating hole or elongated slot formed in the printed circuit board and are held in place further by the contact with the aluminum heat sink plates on both sides as well as the "J" lead connections, which eliminates the use of adhesive sheeting.

U.S. Pat. No. 3,351,816 by Sear, et al. teaches the use of a heat conducting aluminum plate, however, this aluminum plate actually is a type of circuit board serving the dual function of printed circuit board and heat sink, a series of such boards being bonded together. Being bonded together, such printed circuit boards are not readily removed from each other for repair or replacement as is found in the present invention. Further, this concept does not include provision for a combined optical buss.

U.S. Pat. No. 2,963,538 by Dahlgren teaches the use of glass fibers in a flat cable. The use of such glass fibers by Dahlgren is for the purpose of providing strength to the cable and does not anticipate the use of glass fibers for the transmission of data by optical fiber in combination with a printed circuit board.

U.S. Pat. No. 3,366,914 discloses an insertable solderless connector with a concept quite different to that of the present invention. This patent illustrates a two-piece connector, having a flange to engage one side of a printed circuit board and a compressible lip to engage the opposite side after insertion through a hole in the printed circuit board. This device appears to be intended for manual insertion as the specification recites a necessity to trim off projecting contact ends after insertion. The present invention provides a one piece chip carrier which is held securely by the contact with the heat sink plates, using no flanges, and requiring no trimming.

U.S. Pat. No. 3,365,620 by Butler, et al. teaches a multi-layered printed circuit board system that embodies an internal cooling system, however, unlike the present invention, the Butler patent discloses a liquid cooling system.

U.S. Pat. No. 3,133,773 by Ecker illustrates a configuration which, at first glance, resembles the present invention in regard to the glass fiber optical cables imbedded in the interior of the printed circuit board. Further reading of the Ecker patent discloses that the conductors imbedded in the material of the circuit board are of insulated copper wire and do not relate to the fiber optic system embodied in the present invention.

Accordingly, it becomes apparent that the combination of features found in the present invention are not found in the references cited from the prior art, and that the present invention presents a novel and valuable departure from the prior art, as will be further demonstrated in the detailed description that follows.

SUMMARY OF THE INVENTION

The present invention arises from several major concepts. Included is a method in which various chip carriers are press fitted, manually or by machine, into corresponding openings in a printed circuit board, rather than being soldered in place.

Each printed circuit board may contain an optical fiber network within the body of the printed circuit board. This optical fiber network forms an optical buss to interconnect the chip carriers and also to interconnect the optical buss with the printed circuit electrical data system. Data or address information is exchanged between chip carriers via the optical buss. Multiple printed circuit board layers are separated by aluminum plates which form heat sinks. The aluminum plates also act as edge guides for rack-mount applications of a multi-printed circuit board system. Multiple chip carriers may interface to the optical buss and a card edge connector is provided to interface the optical printed circuit board buss with incoming data cables.

Although various materials may be mentioned for use in the present invention, there is no intent to restrict the invention to the use of any such materials. Printed circuit boards that have been widely manufactured of layers of fiberglass and epoxy, are being replaced by new plastic and paper materials.

It is anticipated that such "optic fibers" as described herein may include an optical waveguide cut or molded into a printed circuit board. Another alternative is a polymer film with optical waveguides (from 3M Co. TM) or a new polymer holographic film (from Polaroid TM) and single mode or multi-mode fibers can be used. The beam-splitting prism described herein can also be synthesized from the polymer holographic film (Polaroid). The specific materials chosen for a particular application of the invention will be determined by the specific needs of the particular application.

Although the novel features of the present invention are numerous, a few of the more prominent advantages are:

1. Speed of input/output data transfers; a single optical fiber carrying serial data is many times faster than sixty four wires carrying parallel data.

2. Thermal capacity and stability; the aluminum plates not only provide a rugged monolithic circuit structure and shielding, but they also carry away a large amount of heat with a small thermal gradient. This shielding also provides immunity to E.M.P. destruction which is very important in military applications.

3. Increased pinout; as chips become more dense and complicated, the edge-length to surface area ratio becomes increasingly problematic and becomes acute with wafer scale integration. By going direct to the surface of the circuits with optical data, the required pincount of electrical contacts is eased.

4. Increased bandwidth, response time. settling time, aperture time, and slew rate are a direct result of optical signal transfer from chip-to-chip on a printed circuit board or from circuit-to-circuit on a wafer.

5. When all data or signals are optical, they cannot be jammed or detected by electronic measure means. They also will not cause interference affecting other nearby equipment and the optical signals are not affected by radiation from nearby equipment.

6. Readily apparent applications for use of this invention include real-time video processing, artificial intelligence hardware, high speed memory or computer systems, and military equipment of various types.

Accordingly, it is a primary object of this invention to provide a printed circuit board incorporating an optical buss system for transmission of optical light data within said printed circuit board.

It is a principal object of the present invention to provide a method to intercept optical data signals transmitted through such optical data buss, convert such optical data signals to electrical data signals, and to transmit such electrical data signals to electrical circuitry of a printed circuit board.

It is a further object of the present invention to intercept electrical data signals from the circuitry of a printed circuit board and to convert such electric data signals to optical light data signals and to transmit such light data signals into the aforementioned optical buss.

It is another object of the present invention to provide an optical buss having a bi-directional optical pathway within a printed circuit board, such bi-directional pathway capable of transmitting optical data horizontally and laterally within said printed circuit board and vertically between packed layers of printed circuit boards.

Still another object of the present invention is to provide the novel chip carrier containing a beam-splitter for directing optical data from such optical buss and into such optical buss.

An additional object of the present invention is to provide the novel chip carrier with a light focusing lens for light signal reception.

One more object of the present invention is to provide the novel chip carrier with a clear transparent window for receiving and transmitting light data and also permitting such light data signals to pass through to another chip carrier and thereby allowing the use of multiple chip carriers in a cell group.

A still further object of the present invention is to provide a novel connector to interface a printed circuit board and provide optical data input to such board as well as electrical data and power input.

An additional object of the present invention is to provide the aluminum heat sink plates between printed circuit boards for heat removal and also to serve as a card edge guide for secure positioning of printed circuit boards when used in a layered stack.

Another important object of the present invention is to provide an optical buss to interface with an integrated wafer that contains an optical data system.

In accordance with the invention, there is provided an optical data buss incorporated in a printed circuit board by having optical fibers embedded in the body of the board. Holes formed in the printed circuit board receive a press fitted chip carrier which is also provided with a transparent area that interfaces with the optical fibers. Optical data entering the chip carrier is intercepted by an optical beam-splitter where the signals are directed to a phototransistor die for conversion to electrical signals which are then conducted to the printed circuit board. Electrical data signals from the printed circuit board may be conducted to the chip carrier which also contains a phototransmitter die where the electrical data signals are converted to optical signal and are projected to a beam-splitter for deflection into optical fiber circuitry. When arranged in a stack, printed circuit boards are separated by physically contacting heat conductive plates which may be aluminum, that act as heat sinks for cooling purposes. Holes drilled through the plates allow optical data signals to be projected from any one printed circuit board to another in the stack. A novel connector is provided to supply electrical power, electrical data input, and optical data input to the system. The optical circuitry is bidirectional.

The invention will be better understood upon reference to the following descriptions and drawings in which:

DETAILED DESCRIPTION

Figure 1:
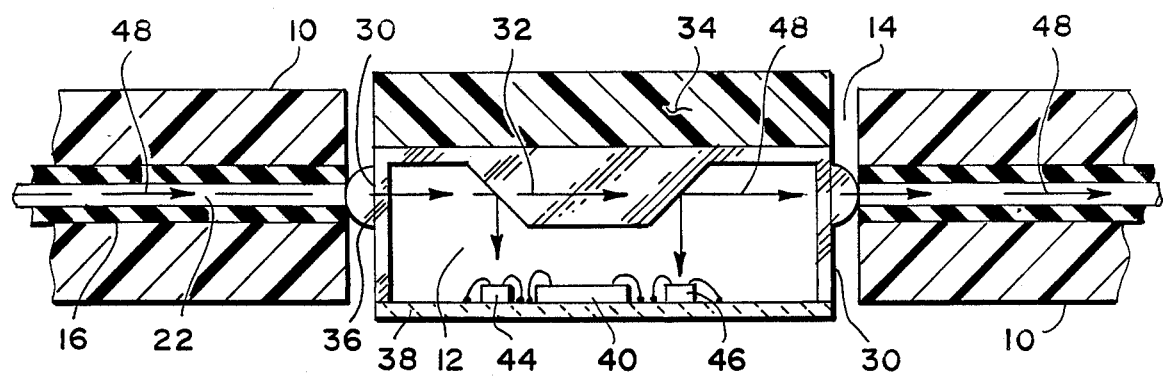
FIG. 1 is a diagramatic side view of a portion of a printed circuit board with a single chip carrier inserted and connected.

Referring to the drawings by characters of reference, FIGS. 1-15 illustrate a printed circuit board with an optical data buss.

Figure 9:
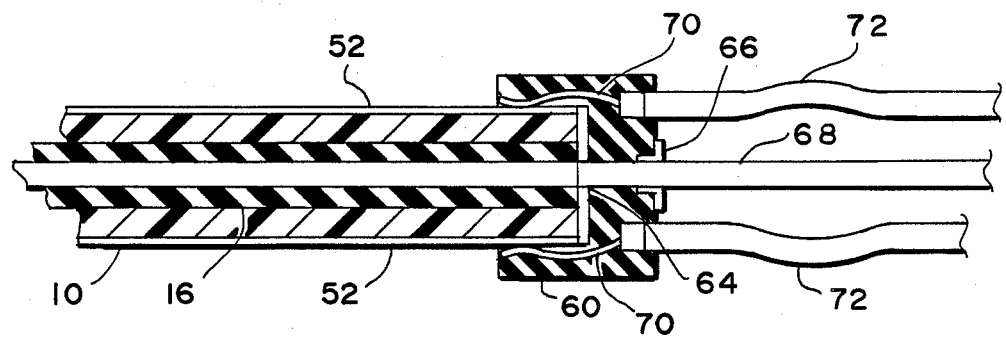
FIG. 9 is a diagramatic side view of a portion of a printed circuit board showing a card edge connector providing both optical and electrical connections.
Figure 10:
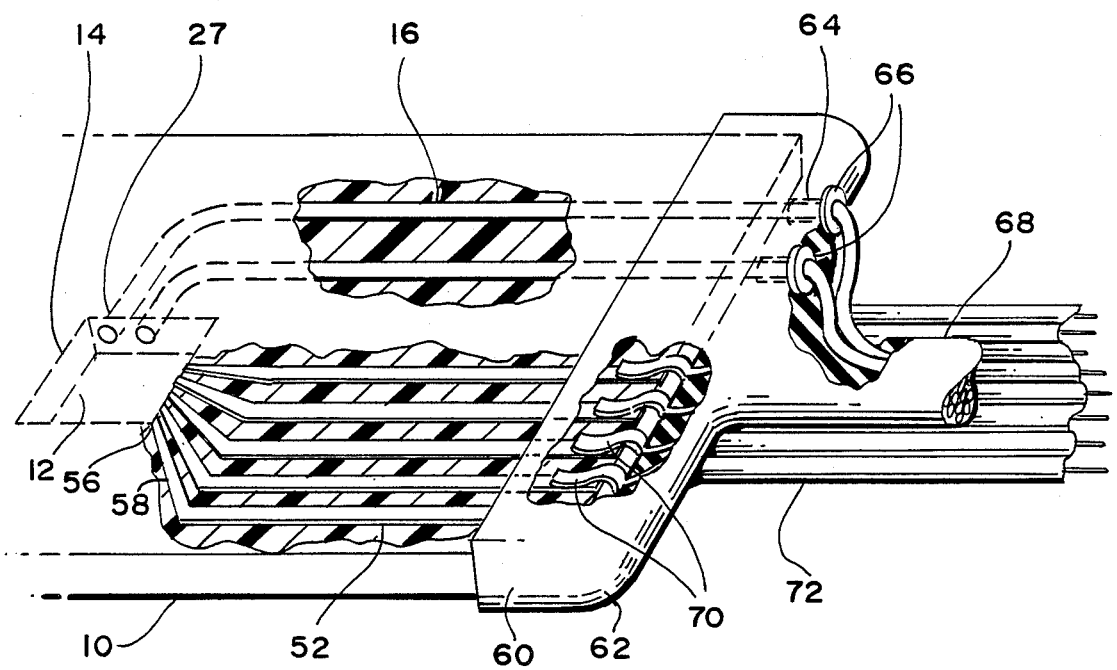
FIG. 10 is a perspective broken view of a portion of a printed circuit board and a card edge connector, showing internal circuitry, both optical and electrical.

FIG. 1 is a diagramatic side view of a printed circuit board 10. A hole 14 is formed in the printed circuit board 10 to receive the chip carrier 12. Optic fibers 16 are embedded within the printed circuit board 10 and form the optical pathway 22 for the transmission of optical data to the chip carrier 12. Optical data is transmitted to the optical fibers 16 from the data source by means of the fiber optic bundle 68 as shown in FIGS. 9 and 10. The fiber optic bundle 68 interfacing the optic fiber 16 embedded in the printed circuit board 10 by means of optical connector 64 as shown in FIG. 10 and is held in place by the brass ferrule 66. Light transmitted along the optical pathway 48 passes through an optional lens 36 where light is focused and projected through the clear plastic side of the chip carrier 12. The light transmitted data signals entering chip carrier 12 are intercepted by the beam splitter 32 which deflects a portion of the light for interception by the photo transistor die 44 where the light signals are converted into electrical signals. The electrical signals are conducted by wire connections to integrated circuit die 40. The same electrically transmitted data is also conducted by circuitry to the photo transmitter die 46 which is positioned within the chip carrier 12 to emit light signals to the deflecting surface of the beam splitter 32, where the light signals are deflected back into the continuing optical pathway 48.

The photo transistor die 44, the integrated circuit die 40 and the photo transmitter die 46 are attached to the ceramic substrate 38 with epoxy in a manner that is standard in the industry and the electrical connections between the die 44, the die 40 and the die 46 are accomplished by wire bonding which is also standard in the industry. The chip carrier 12 is of molded construction with the beam splitter 32 as a part of the molding. The substrate 38 and the spacer block 34, in the preferred embodiment, are opaque to avoid the entrance of extraneous light to the interior of the chip carrier 12. Non-opaque materials could be used, however, if the chip carrier is otherwise shielded from extraneous light.

Figure 2:
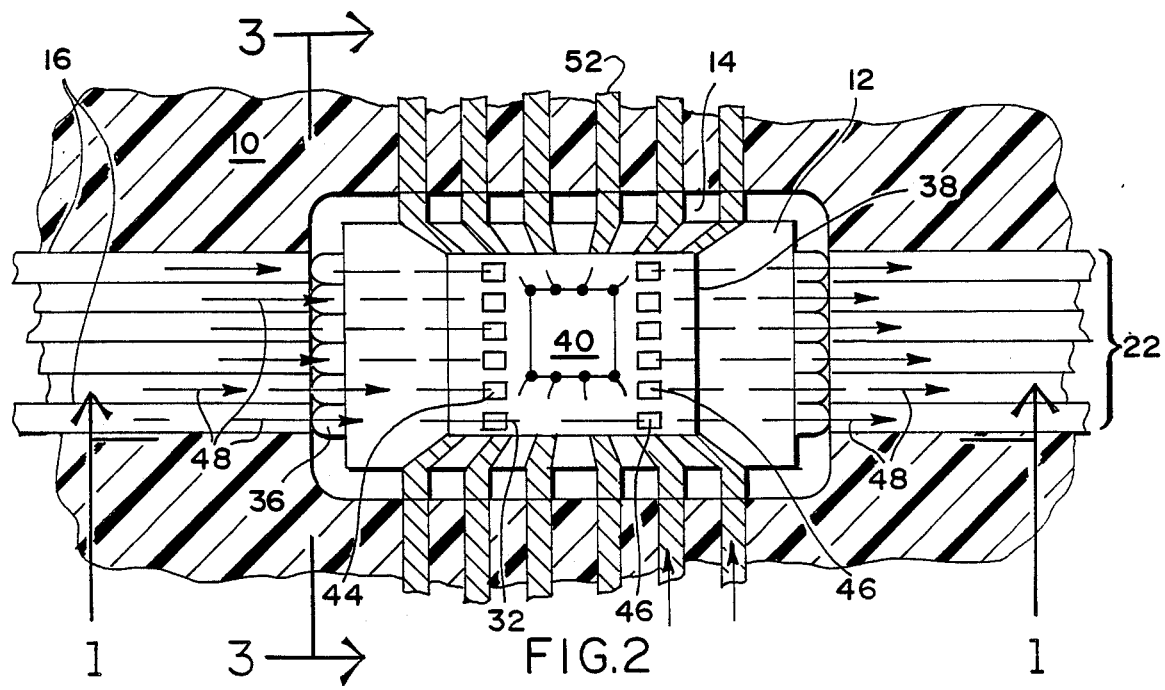
FIG. 2 is a diagramatic top view of a portion of a printed circuit board with a single chip carrier inserted and circuitry related thereto.

FIG. 2 is a top view of the invention and illustrates a section of the printed circuit board 10 containing six fiber cables 16 forming an optical pathway 48 which is interrupted by a chip carrier 12. An optical lens 36 (optional) is shown to collect and focus light signals from the fiber optic cables 16 and project these signals to the beam-splitter 32. A photo transistor die 44 is shown for each of the six fiber optic cables, an integrated circuit die 40 for distribution of electrical data, and a photo transmitter die 46 for each of the six fiber optic cables forming a continuing optical pathway. FIG. 2 also shows that electrical signals that are conducted by wire connections to integrated circuit die 40 may further be electrically conducted by "J" leads 56, which in turn connect to the electrical conductor tracks 52 of the printed circuit board 10. The "J" leads 56 are better seen in FIG. 3.

Figure 3:
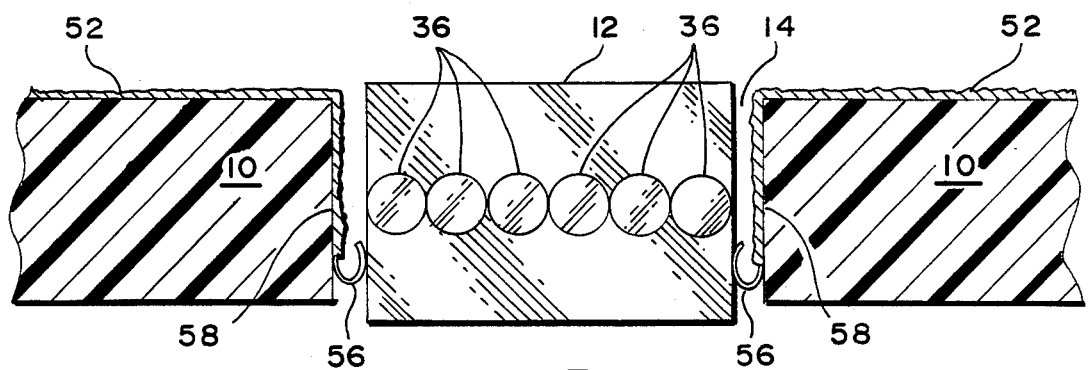
FIG. 3 is a diagramatic end view of a portion of a printed circuit board with a single chip carrier inserted therein and showing optional optical lens on the chip carrier as well as electrical conductor track and connections.

FIG. 3 is an end view of a section of the printed circuit board 10 showing an electrical conductor track 52 extending from the surface of the board into the hole 14 into which a chip carrier 12 is positioned and making contact with the "J" lead electrical connectors 56. The lenses 36 are shown in position on the chip carrier 12. Also shown is the connection of the "J" lead 56 to the electrical conductor track 52 by the use of conductive epoxy 58, which is a technique known in the art.

Figure 4:
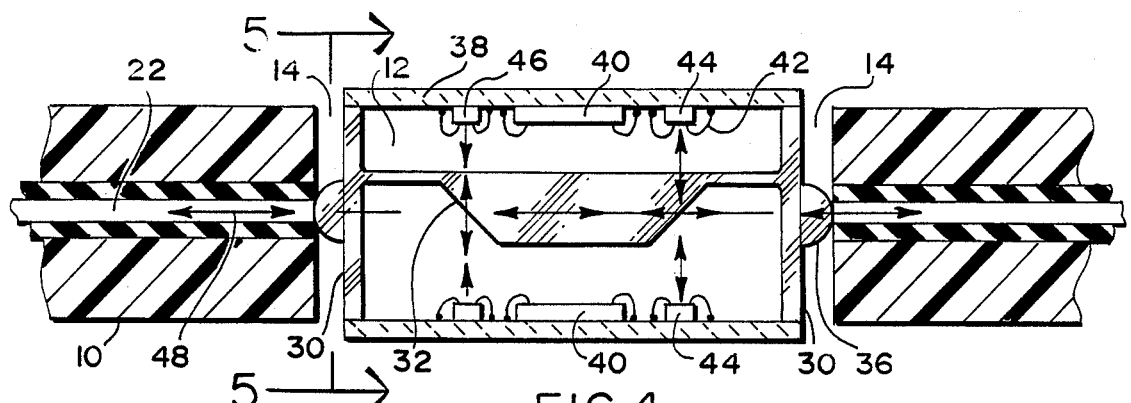
FIG. 4 is a diagramatic side view of a portion of a printed circuit board with a dual chip carrier inserted and related circuitry.

Turning now to FIG. 4, a variation is shown that differs from that shown in FIG. 1, in that FIG. 4 illustrates the use of a dual chip carrier 12 having an ability to provide an interface to the optic fiber cord 16 resulting in an optical printed circuit board buss in a bi-directional (dual) optical pathway. The chip carrier 12 is pressed into hole 14 of printed circuit board 10 which contains the optical fibers 16 forming an optical printed circuit board buss.

The chip carrier 12 comprises a clear plastic body providing a clear plastic window side wall 30 (use of lens 36 is optional) and interior beam-splitter 32. Top and bottom substrates 38 are provided, both top and bottom substrates 38 having a photo transistor die 44, an integrated circuit die 40 and a photo transmitter die 46, both top and bottom die components receiving light data signals by means of the beam-splitter 32. The photo transistor dies 44, the integrated circuit dies 40 and the photo transmitter dies 46 are connected as shown by the use of conductive epoxy or wire bonds for electrical connections. The optical pathway 48 is shown to be dual or bi-directional. Accordingly, a dual or bi-directional printed circuit board buss is provided.

Figure 5:
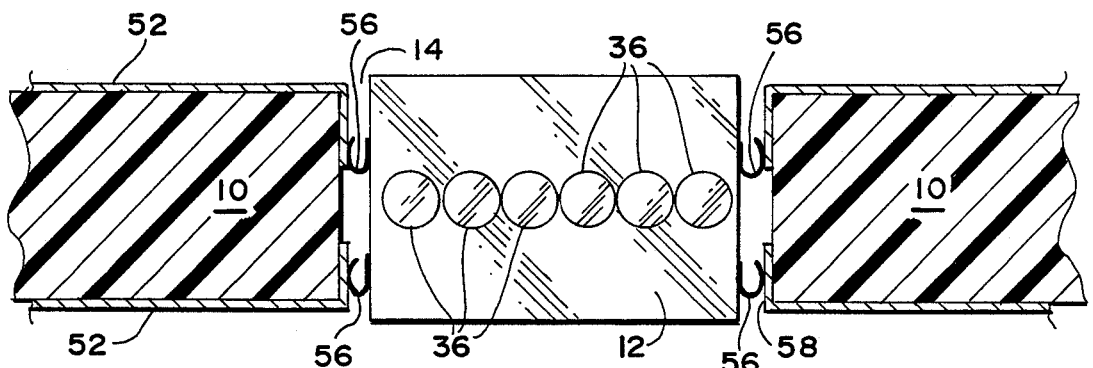
FIG. 5 is an end view of a portion of a printed circuit board with a dual chip carrier inserted therein together with lens and circuitry.

FIG. 5 is an end view of a printed circuit board section with the chip carrier 12 mounted in the hole 14. For use of the dual chip carrier, extensions of electrical tracks 52 are mounted within the hole 14, extensions being connected to printed circuitry on both sides of the printed circuit board 10 and making separate connections with the top and bottom die circuitry within the chip carrier 12. The chip carrier circuitry is connected to the electrical conductor track extensions by the "J" leads 56 at the top and bottom of the chip carrier 12. The "J" leads 56 are connected to the electrical conductor tracks 52 by use of conductive epoxy 58. The optional lens 36 is also shown.

Figure 6:
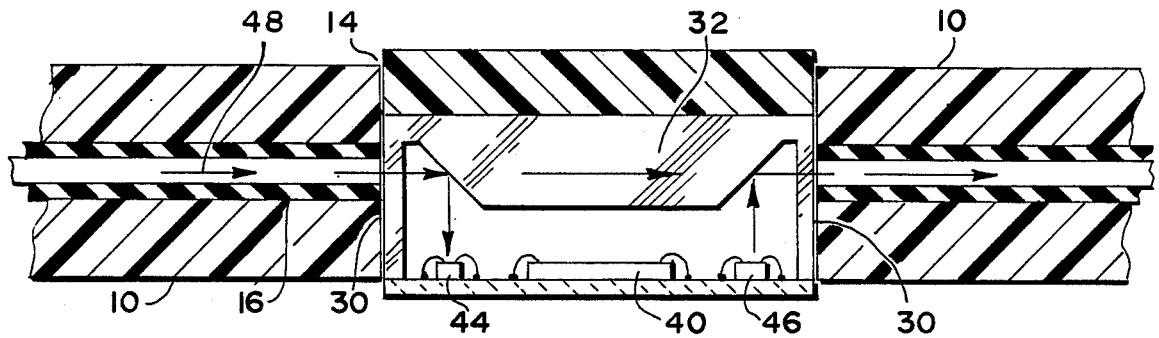
FIG. 6 is a diagramatic side view of a portion of a printed circuit board with a single chip carrier inserted therein and showing the use of a clear window instead of the optical lens.

FIG. 6 is a side view of a single chip carrier shown positioned within the hole 14 of a section of a printed circuit board 10. The description of FIG. 1 applies to FIG. 6 with the exception that the optional lens 36 in FIG. 1 is not shown and FIG. 6 shows the use of a window area of the clear plastic wall member 30 of the chip carrier 12. the clear window area 30 allowing direct light transmission to the beam splitter 32. As shown in FIG. 3 and FIG. 5, the "J" leads 56 would provide electrical connections with the electrical conductor track 52 of the printed circuit board 10. The "J" leads 56 may be soldered to the electrical conductor tracks 52, but the preferred method is use of a press fit or conductive epoxy 58 (FIG. 3). As in the manner described in FIG. 1, both electrical connections and optical data communication are provided to the chip carrier. Integrated circuit power is taken from the electrical connection and data or address information is transmitted along the optical pathway. Many of these drawings show six optic fiber cables for illustration purposes, but this number of optic fiber cables is not intended to limit the present invention to any particular capacity, the number of optic fiber cables and cooperating chip carriers varying according to the particular application of the system.

Figure 7:
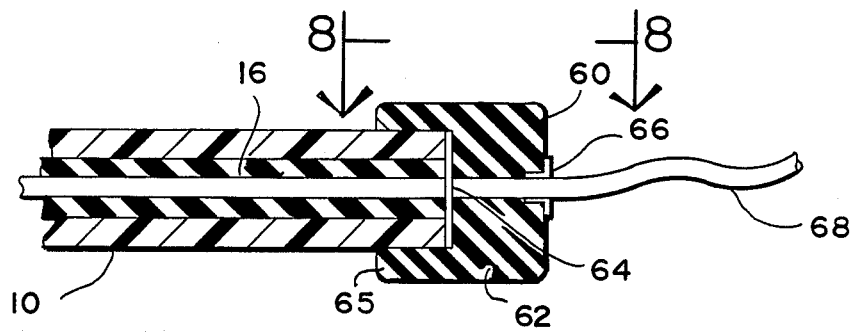
FIG. 7 is a diagramatic side view of a portion of a printed circuit board and illustrates the use of a card edge connector to provide an interface of an optic fiber cable with the optic fibers within the printed circuit board.

FIG. 7 illustrates a card edge connector with a side view of a portion of a printed circuit board 10. The connector is provided with a molded body 62 with a molded gripping segment 65 for maintaining a firm pressure grip on the upper and lower sides of a printed circuit board. The fiber optic cable 68 passes through the connector body 62 being secured with brass ferrule 66, and interfaces with a corresponding optic fiber cable 16 within the interior of printed circuit board 10. The fiber optic cable 68 is secured by the brass ferrule 66, but may be so secured by other means. Incoming optic data is projected into the optical fiber 16 through an optional lens 64 or through a clear window as previously shown in FIGS. 4, 5 and 6. Incoming data is then transmitted to the printed circuit boards and to other printed circuit boards and connecting optical pathways throughout the system.

Figure 8:
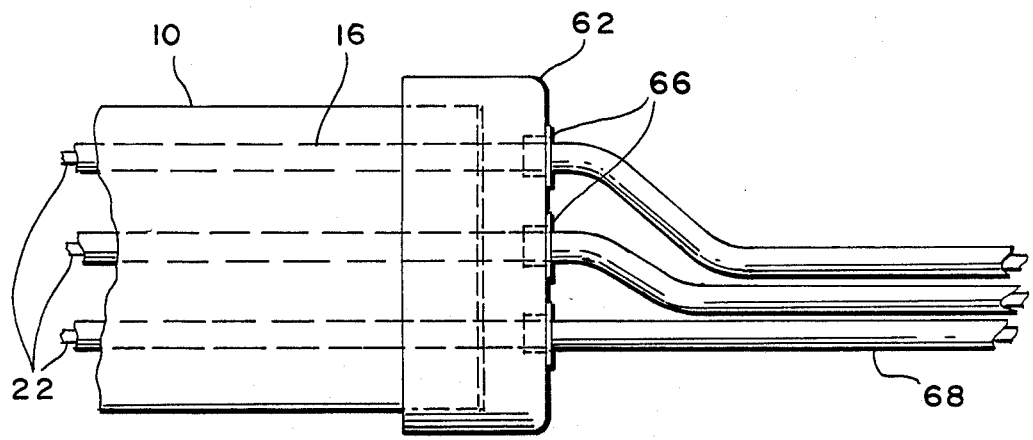
FIG. 8 is a top view of a portion of a printed circuit board with multiple optic fiber cables passing through a card edge connector and interfacing with optical fibers within the printed circuit board.

FIG. 8 is a top view of the card edge connector shown in FIG. 7 and shows a portion of a printed circuit board 10 attached to the molded plastic connector body 62. Fiber optic cables 68 projecting through molded plastic connector body 62, transmit optical data to optical fiber buss 22 of printed circuit board 10, fiber optic cables 68 interfacing with the optic fiber 16 of printed circuit board 10. The fiber optic cables 68 are secured tightly in the molded plastic connector body 62 by the brass ferrules 66. Although FIG. 8 shows a total of three cables interfacing with the printed circuit board 10, it is to be understood that the present invention is not so limited and that the number of optic cables connections is limited only by the size of the printed circuit board and the size of the card edge connector, which would be determined by the application of the system and is not limited to any particular size or shape.

FIG. 9 illustrates a card edge connector having optical fiber connection with a printed circuit board 10 together with electrical conductor connection. The molded plastic connector body 62 provides fiber optic data connections to the printed circuit board 10 in the same manner as in the previous description of FIG. 7 and FIG. 8, but also shows electrical connections through the card edge connector body 62 to the printed circuit board 10. The tensioned finger tabs 70 are connected to the insulated ribbon cable 72 and engage the surface of the electrical conductor track 52 formed on the surface of the printed circuit board 10. The finger tabs 70 are mounted on the body of the card edge connector 62 and the insulated ribbon cable 72 is connected to the finger tab. In this manner, both optical data and electrical data may be transmitted to the printed circuit board at the same time.

FIG. 10 is a perspective view of an end portion of a printed circuit board showing optical and electrical connections to a printed circuit board as provided by the present invention. The card edge connector 60 is engaged to the printed circuit board 10. The fiber optical transmission cables 68 pass through the molded connector body 62, being secured by the brass ferrules 66, interface with the optic fiber cables 16 embedded within the printed circuit board 10. The optional lens 64 may be present to focus incoming light data to the interface with the optic fibers 16. Optically transmitted data is then transmitted to predetermined connections throughout the circuitry of the printed circuit board including the buss interface 22 with the chip carrier 12 mounted in the hole 14 of printed circuit board 10. The electrical conducting ribbon cables 72 also pass through the molded connector body 62 connecting with the tensioned finger tabs 70 which are in turn in tensioned contact with the electrical conductor track 52 on the surface of the printed circuit board 10, and thereby transmitting electric data and power to the printed circuit. An electrical conductor track 52 connects with the chip carrier 12 through a "J" lead 56 (not shown, see FIG. 3) and conductive epoxy 58. As set forth in the foregoing description, electrical data, electrical power, and optical data are transmitted to the printed circuit board and may be distributed as required by the needs of any particular application.

Figure 11:
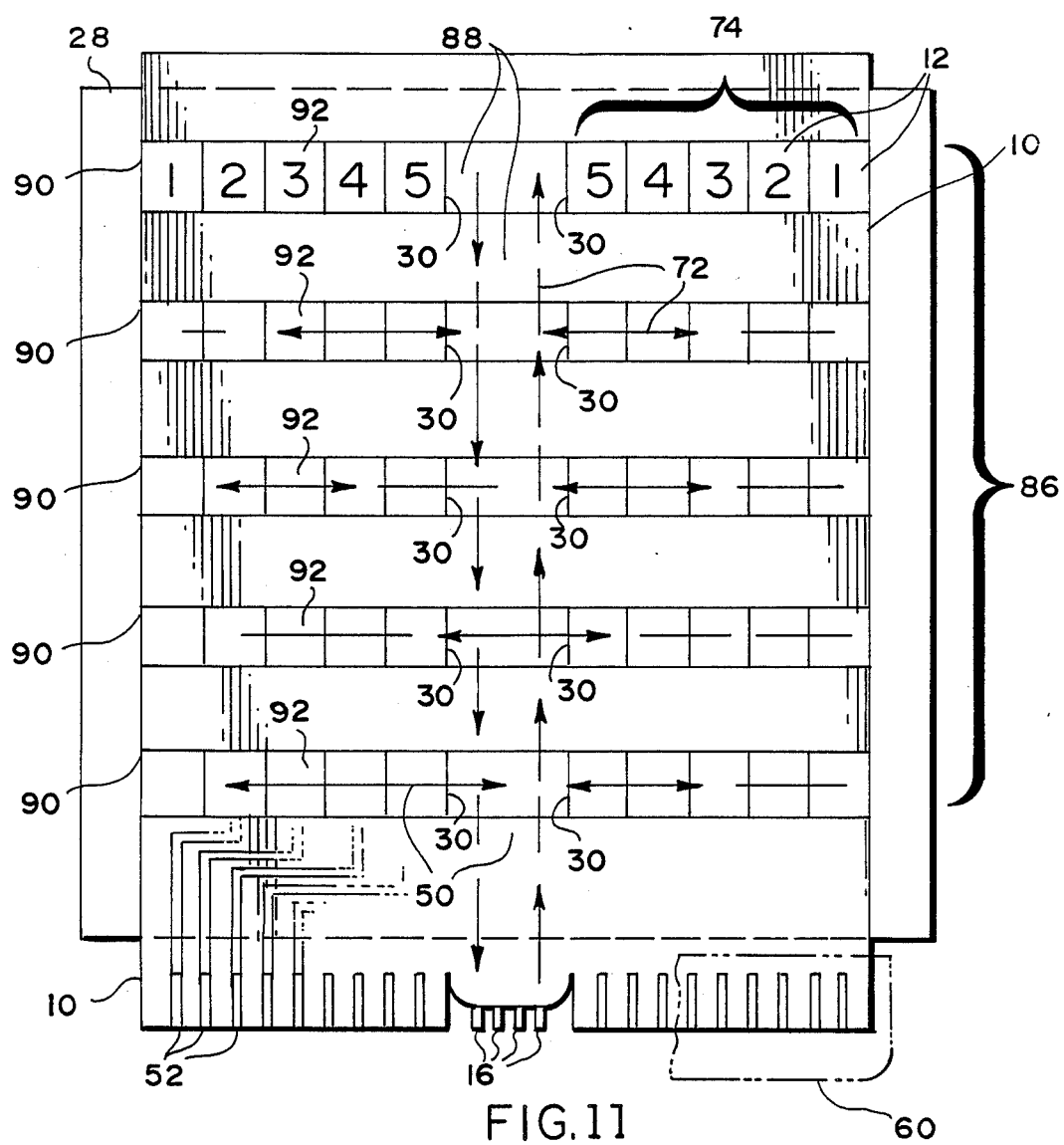
FIG. 11 is a top view of a printed circuit board illustrating the mounting of cell groups of chip carriers within slots in the printed circuit board with optical cable connections and electrical connections together with an aluminum plate heat sink.

FIG. 11 shows a top view of printed circuit board 10 having the novel ability to provide an optical buss with a dual or bi-directional central optical pathway and the capability of providing a cross-directional lateral pathway as well. The central bi-directional pathway 50 is intersected by the grooves 90 that are provided for retaining groups of chip carriers. Each of the chip carriers is provided with a clear window 30 on opposite sides of each carrier so that light transmitted signals may pass through the entire group of chip carriers when the chip carriers are grouped tightly together with the clear windows aligned one to the other. This method creates a continuous optical pathway laterally through the cell group. Optical data signals transmitted along the bi-directional optical pathway 50 are intercepted by passive optical beam-splitters 88 positioned in the retaining grooves 90 but within the bi-directional optical pathway 50. Optical data signals intercepted by beam splitter 88 are deflected laterally to the right and to the left and pass through the clear windows 30 of the various cell groups 86 of chip carriers. The electrical conductor tracks 52 and the optical fiber cables 16 of the printed circuit board 10 are to be engaged by the electro-optical connector 60 as shown in FIG. 10 to provide data input to both electrical and optical circuitry of the printed circuit board 10. FIG. 11 also shows an aluminum plate heat sink 28 positioned behind the printed circuit board 10. The heat sink 28 also acts as a card edge guide for alignment and retention of printed circuit boards 10 when assembled in a multi-layer arrangement, such as shown in FIG. 13.

Figure 12:
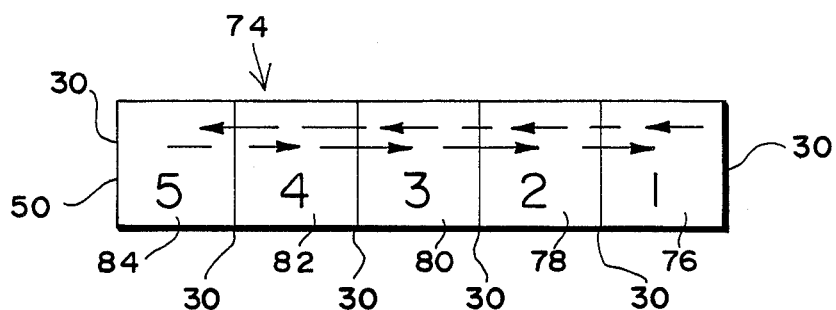
FIG. 12 illustrates a typical cell group such as that shown in FIG. 11.

FIG. 12 illustrates a chip carrier cell group, one of many combinations that may be used in the invention, and shows that the optical pathway through the cell group may be bi-directional. Cell 76 is an input/output cell. Light signals enter the first cell 76 through the clear window 30 and exit the first cell 76 into the second cell 78 through windows 30. The second cell 78 may be a micro-processor. Light signals continue through clear windows 30 into a third cell 80, which may be a kernel operating system, a fourth cell 82, and into which may be a read only memory cell, and into a fifth cell 84, which may be a random access memory cell. Although only the foregoing types of cells are specifically described, it is not intended that the invention be so limited, but that the invention, as described, anticipates the inclusion of all such cell components as may be suitable for use therewith.

Figure 13:
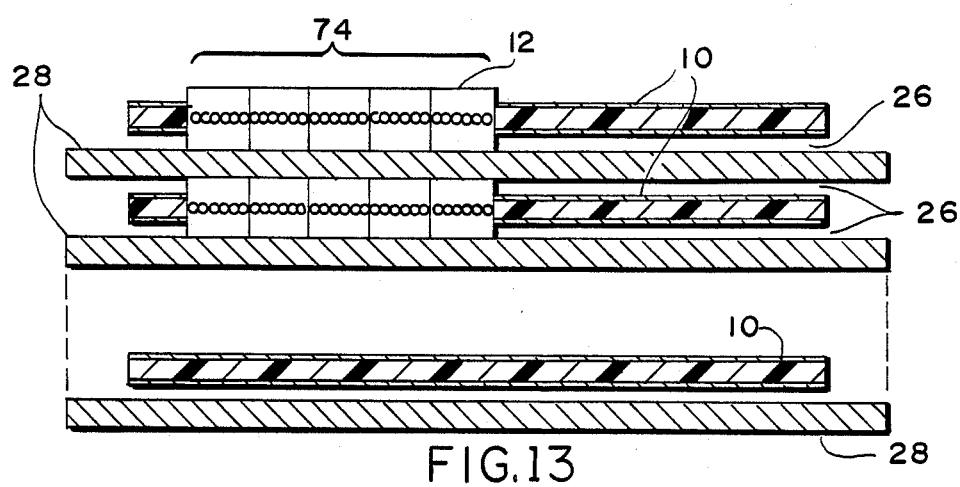
FIG. 13 is a cross-sectional side view of layered printed circuit boards with aluminum plate heat sinks and chip carriers in place.

Turning now to FIG. 13, a multi-board assembly is illustrated in a side view showing the printed circuit boards 10 assembled with the cell group 74 mounted in grooves 90 of the printed circuit board 10. The cell group is composed of a plurality of the chip carriers 12 and is held in physical contact on both sides with the aluminum plate heat sink 28. As the thickness of the chip carriers 12 is greater than the thickness of the printed circuit board 10, the chip carriers 12 protrude beyond the outer surfaces of printed circuit board 10, leaving an air space 26 between the printed circuit boards 10. Heat generated by the activity of electronic components within the system is conducted outwardly through the heat sink plates 28 and can then be dissipated into the surrounding atmosphere. The aluminum plate heat sink 28 also serves as a card edge guide to properly maintain the position of the various printed circuit boards when assembled in a multi-board pack.

Figure 14:
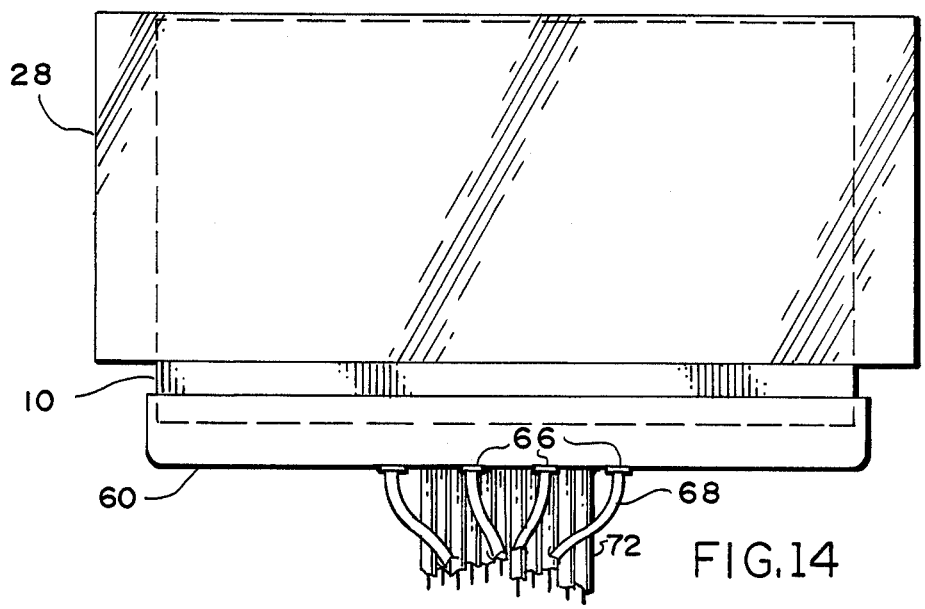
FIG. 14 is a top view of a printed circuit board showing a card edge connector providing optical and electrical connections and also an aluminum plate heat sink.

FIG. 14 shows a top view of printed circuit board 10. An aluminum plate heat sink 28 is positioned behind printed circuit board 10 and protrudes laterally to each side. An electro-optical connector 60 is shown engaging the printed circuit board 10 with the optical fiber cable 68 and the electric ribbon cable 72 entering the connector 60, cable retaining brass ferrules 66 are shown in place.

Figure 15:
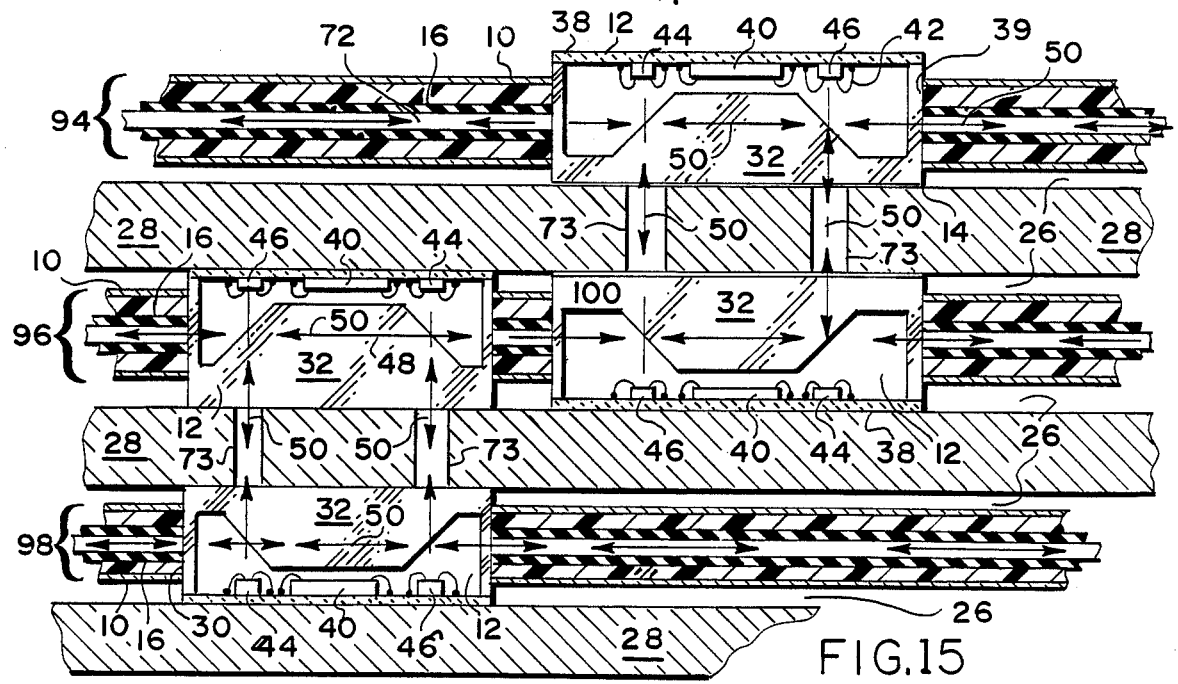
FIG. 15 is a diagramatic side view of a portional of a multi-layered stack of printed circuit boards together with aluminum plate heat sinks and illustrates a manner in which optical light data is transmitted vertically between layers of printed circuit boards as well as horizontally within layers.

FIG. 15 shows a cross sectional side view of portions of three printed circuit boards arranged in a layered pack. Each printed circuit board 10 is separated by an aluminum plate heat sink 28 and air spaces 26, where appropriate. The preceding descriptions of FIGS. 1-12 related the manner in which an optical printed circuit buss is achieved horizontally within an individual printed circuit board, including lateral distribution to multi-cell groups. FIG. 15 now demonstrates that an optical printed circuit board buss, provided by the present invention, is achieved vertically between layers of printed circuit boards as well as horizontally. The lower printed circuit board 98 has a bi-directional optical pathway 50 which is intercepted by the chip carrier 12.

The chip carriers 12 in the vertical system differ from the chip carrier 12 shown in FIG. 1 in that an opaque spacer block is replaced by a clear spacer block and the opaque substrate is replaced by a clear substrate in order that light transmitted optical data will pass through. To provide an optical bi-directional pathway from printed circuit board 98 to circuit board 96, the holes 73 are drilled through the aluminum plate heat sink 28. Optical data transmitted along the bi-directional pathway 50 of printed circuit board 98 is reflected upward through optical pathway 50 of the hole 73 by the beam-splitter 32 of printed circuit board 98, such reflected optical data being intercepted in turn by the beam-splitter 32 of the chip carrier 12 in printed circuit board 96 and also by the photo-transistor die 44 mounted therein. Optical data received by photo-transistor die 44 is converted to electric data and transmitted to the electric printed circuit of the printed circuit board 96, and also to the photo-transmitter die 46 for downward projection to the bi-directional optical pathway 50 of printed circuit board 98 and to photo-transistor die 44 of the printed circuit board 98 for further transmission. Optical data transmitted by the bi-directional pathway 50 of printed circuit board 96 is also intercepted by the second chip carrier 100 where such data is reflected upwardly to a chip carrier in printed circuit board 94 in the same manner as that related for optical data transmission between circuit board 98 and circuit board 96.

The drawing of FIG. 15 only shows the use of the invention with three printed circuit boards but it is expressly emphasized that the concept of the present invention is not limited to a particular number of printed circuit boards, but includes any number of printed circuit boards as may be required for any particular application of the invention. The method of vertical optical data transmission as set forth above may be continued to include many more printed circuit boards than shown in FIG. 15. The invention concept described herein presents a very novel and useful invention and a very substantial departure from the prior art, particularly by the close packed nature and combination of optical and electrical data transmission.

Although but a few of the embodiments of the invention have been shown and described, it will be apparent to those skilled in the art that various changes and modifications may be made therein without departing from the spirit and scope of the invention as defined solely by the appended claims.

What is claimed is:

1. An electrical circuit and optical data buss comprising:
    an electrical circuit board having electrically conductive circuitry;
    optical signal conducting circuitry mounted on the electrical circuit board, for transmission of optical signals therethrough, said optical signal conducting circuitry including electronic chip carriers having interfaces with said circuitry and also having electrically conductive connections with the electrical circuit board;
    means for interception of optical signals transmitted by the optical signal conducting circuitry;
    means for converting intercepted optical signals to electrically conductive signals, and conductors for transmitting the electrically conductive signals to the electrical circuitry mounted on the electrical circuit board; and
    means for converting electrically conductive signals to optical signals, including means for introducing the optical signals into the optical signal conducting circuitry.

2. The electrical circuit and optical data buss of claim 1 further comprising:

openings formed in the electrical circuit board for receiving and retaining electronic chip carriers, said chip carriers having optical interfaces with the optical signal conducting circuitry.

3. The electrical circuit and optical data buss of claim 1 further comprising:
thermoconductive heat sink means mounted adjacent and in thermal communication with the electrical circuit board for removal and dissipation of heat emanating therefrom.

4. The electrical circuit and optical data buss of claim 3 further comprising electronic chip carriers having a thickness dimension greater than that of the electric circuit board and with the thermo-conductive heat sink means mounted adjacent and in thermal communication with the electronic chip carriers for removal and dissipation of heat emanating from the chip carriers.

5. The electrical circuit and optical data buss of claim 1 wherein the optical signal conducting circuitry is of a material capable of transmitting light.

6. The electrical circuit and optical data buss of claim 5 wherein said material is of glass optic fiber.

7. The electrical circuit and optical data buss of claim 5 wherein said material is a polymer holographic film.

8. The electrical circuit and optical data buss of claim 5 wherein said material is a polymer film with optical waveguides.

9. The electrical circuit and optical data buss of claim 1 wherein the optical signal conducting circuitry includes optical waveguide channels formed in the electrical circuit board.

10. The electrical circuit and optical data buss of claim 1 wherein the optical data conducting circuitry includes an optically unobstructed passageway containing clear glass.

11. The electrical circuit and optical data buss of claim 1 wherein the optical signal conducting circuitry includes transparent areas in the body of an electronic chip carrier.

12. The electrical circuit and optical data buss of claim 1 wherein the optical signal conducting circuitry includes means for the passage of optical signals through each of a plurality of electronic chip carriers having adjacent transparent transmission areas.

13. The electrical circuit and optical data buss of claim 1 wherein the optical signal conducting circuitry includes at least one optical beam splitter for angular deflection and reception of optically transmitted signals.

14. The electrical circuit and optical data buss of claim 1 wherein the optical signal conducting circuitry includes a lens for focusing of optical signals.

15. The electrical circuit and optical data buss of claim 3 wherein the thermoconductive heat sink includes at least one aperture to permit passage therethrough of optically transmitted signals to an electrical circuit board in proximity thereto when a plurality of such boards are arranged in a stack.

16. The electrical circuit and optical data buss of claim 3 wherein the thermoconductive heat sink acts as a card edge guide 17. The electrical circuit and optical data buss of claim 1 wherein the means for converting intercepted optical signals to electrically conductive signals is a phototransistor die.

18. The electrical circuit and optical data buss of claim 1 which further comprises an integrated circuit die.

19. The electrical circuit and optical data buss of claim 1 wherein the means for converting electrically conductive signals to optical signals is a phototransmitter die.

20. The electrical circuit and optical data buss of claim 1 which further comprises an optical beam splitter for introducing optical signals into optical signal conducting circuitry.

21. The electrical circuit and optical data buss of claim 1 wherein the optical signal conducting circuitry is bi-directional.

22. The electrical circuit and optical data buss of claim 1 which further comprises connector means attachable to the electrical circuit board and having means to transmit electrically conductive signals to said electrical circuit board and also having means to transmit optical signals to the optical signal conducting circuitry.

23. The electrical circuit and optical data buss of claim 22 wherein the connector means is detachable from the electrical circuit board.

24. An electrical circuit and optical data buss comprising:
an electrical circuit board having electrically conductive circuitry;
optical signal conducting circuitry mounted on the electrical circuit board, for transmission of optical signals therethrough;
means for interception of optical signals transmitted by the optical signal conducting circuitry;
means for converting intercepted optical signals to electrically conductive signals, and conductors for transmitting the electrically conductive signals to the electrical circuitry mounted on the electrical circuit board;
means for converting electrically conductive signals to optical signals, including means for introducing the optical signals into the optical signal conducting circuitry; and
openings formed in the electrical circuit board for receiving and retaining electronic chip carriers, said chip carriers having optical interfaces with the optical signal conducting circuitry.

25. The electrical circuit and optical data buss of claim 24 further comprising:
thermoconductive heat sink means mounted adjacent and in thermal communication with the electrical circuit board for removal and dissipation of heat emanating therefrom.

26. The electrical circuit and optical data buss of claim 25 further comprising electronic chip carriers having a thickness dimension greater than that of the electric circuit board and with the thermo-conductive heat sink means mounted adjacent and in thermal communication with the electronic chip carriers for removal and dissipation of heat emanating from the chip carriers.

27. The electrical circuit and optical data buss of claim 24 wherein the optical signal conducting circuitry is of a material capable of transmitting light.

28. The electrical circuit and optical data buss of claim 27 wherein said material is of glass optic fiber.

29. The electrical circuit and optical data buss of claim 27 wherein said material is a polymer holographic film.

30. The electrical circuit and optical data buss of claim 27 wherein said material is a polymer film with optical waveguides.

31. The electrical circuit and optical data buss of claim 24 wherein the optical signal conducting circuitry includes optical waveguide channels formed in the electrical circuit board.

32. The electrical circuit and optical data buss of claim 24 wherein the optical data conducting circuitry includes an optically unobstructed passageway containing clear glass.

33. The electrical circuit and optical data buss of claim 24 wherein the optical signal conducting circuitry includes transparent areas in the body of an electronic chip carrier.

34. The electrical circuit and optical data buss of claim 24 wherein the optical signal conductng circuitry includes means for the passage of optical signals through each of a plurality of electronic chip carriers having adjacent transparent transmission areas.

35. The electrical circuit and optical data buss of claim 24 wherein the optical signal conducting circuitry includes at least one optical beam splitter for angular deflection and reception of optically transmitted signals.

36. The electrical circuit and optical data buss of claim 24 wherein the optical signal conducting circuitry includes a lens for focusing of optical signals.

37. The electrical circuit and optical data buss of claim 25 wherein the thermoconductive heat sink includes at least one aperture to permit passage therethrough of optically transmitted signals to an electrical circuit board in proximity thereto when a plurality of such boards are arranged in a stack.

38. The electrical circuit and optical data buss of claim 25 wherein the thermoconductive heat sink acts as a card edge guide.

39. The electrical circuit and optical data buss of claim 24 wherein the means for converting intercepted optical signals to electrically conductive signals is a phototransistor die.

40. The electrical circuit and optical data buss of claim 24 which further comprises an integratred circuit die.

41. The electrical circuit and optical data buss of claim 24 wherein the means for converting electrically conductive signals to optical signals is a phototransmitter die.

42. The electrical circuit and optical data buss of claim 24 which further comprises an optical beam splitter for introducing optical signals into optical signal conducting circuitry.

43. The electrical circuit and optical data buss of claim 24 wherein the optical signal conducting circuitry is bi-directional.

44. The electrical circuit and optical data buss of claim 24 wherein the optical signal conducting circuitry includes electronic chip carriers having interfaces with said optical signal conducting circuitry and also having electrically conductive connections with the electrical circuit board.

45. The electrical circuit and optical data buss of claim 24 which further comprises connector means attachable to the electrical circuit board and having means to transmit electrically conductive signals to said electrical circuit board and also having means to transmit optical signals to the optical signal conducting circuitry.

46. The electrical circuit and optical data buss of claim 45 wherein the connector means is detachable from the electrical circuit board.

47. An electrical circuit and optical data buss comprising:
   an electrical circuit board having electrically conductive circuitry;
   optical signal conducting circuitry mounted on the electrical circuit board, for transmission of optical signals therethrough;
   means for interception of optical signals transmitted by the optical signal conducting circuitry;
   means for converting intercepted optical signals to electrically conductive signals, and conductors for transmitting the electrically conductive signals to the electrical circuitry mounted on the electrical circuit board;
   means for converting electrically conductive signals to optical signals, including means for introducing the optical signals into the optical signal conducting circuitry; and
   thermoconductive heat sink means mounted adjacent and in thermal communication with the electrical circuit board for removal and dissipation of heat emanating therefrom, said thermoconductive heat sink including at least one apperture to permit passage therethrough of optically transmitted signals to an electrical circuit board in proximity thereto when a plurality of such boards are arranged in a stack.

48. The electrical circuit and optical data buss of claim 47 further comprising:
   openings formed in the electrical circuit board for receiving and retaining electronic chip carriers, said chip carriers having optical interfaces with the optical signal conducting circuitry.

49. The electrical circuit and optical data buss of claim 47 further comprising electronic chip carriers having a thickness dimension greater than that of the electric circuit board and with the thermo-conductive heat sink means mounted adjacent and in thermal communication with the electronic chip carriers for removal and dissipation of heat emanating from the chip carriers.

50. The electrical circuit and optical data buss of claim 47 wherein the optical signal conducting circuitry is of a material capable of transmitting light.

51. The electrical circuit and optical data buss of claim 50 wherein said material is of glass optic fiber.

52. The electrical circuit and optical data buss of claim 50 wherein said material is a polymer holographic film.

53. The electrical circuit and optical data buss of claim 50 wherein said material is a polymer film with optical waveguides.

54. The electrical circuit and optical data buss of claim 47 wherein the optical signal conducting circuitry includes optical waveguide channels formed in the electrical circuit board.

55. The electrical circuit and optical data buss of claim 47 wherein the optical data conducting circuitry includes an optically unobstructed passageway containing clear glass.

56. The electrical circuit and optical data buss of claim 47 wherein the optical signal conducting circuitry includes transparent areas in the body of an electronic chip carrier.

57. The electrical circuit and optical data buss of claim 47 wherein the optical signal conducting circuitry includes means for the passage of optical signals through each of a plurality of electronic chip carriers having adjacent transparent transmission areas.

58. The electrical circuit and optical data buss of claim 47 wherein the optical signal conducting circuitry includes at least one optical beam splitter for angular deflection and reception of optically transmitted signals.

59. The electrical circuit and optical data buss of claim 47 wherein the optical signal conducting circuitry includes a lens for focusing of optical signals.

60. The electrical circuit and optical data buss of claim 47 wherein the thermoconductive heat sink acts as a card edge guide.

61. The electrical circuit and optical data buss of claim 47 wherein the means for converting intercepted optical signals to electrically conductive signals is a phototransistor die.

62. The electrical circuit and optical data buss of claim 47 which further comprises an integratred circuit die.

63. The electrical circuit and optical data buss of claim 47 wherein the means for converting electrically conductive signals to optical signals is a phototransmitter die.

64. The electrical circuit and optical data buss of claim 47 which further comprises an optical beam splitter for introducing optical signals into optical signal conducting circuitry.

65. The electrical circuitry and optical data buss of claim 47 wherein the optical signal conducting circuitry is bi-directional.

66. The electrical circuit and optical data buss of claim 47 wherein the optical signal conducting circuitry includes electronic chip carriers having interfaces with said optical signal conducting circuitry and also having electrically conductive connections with the electrical circuit board.

67. The electrical circuit and optical data buss of claim 47 which further comprises connector means attachable to the electrical circuit board and having meas to transmit electrically conductive signals to said electrical circuit board and also having means to transmit optical signals to the optical signal conducting circuitry.

68. The electrical circuit and optical data buss of claim 67 wherein the connector means is detachable from the electrical circuit board.

* * * * *